United States Patent
Lee et al.

(10) Patent No.: US 11,023,316 B2
(45) Date of Patent: *Jun. 1, 2021

(54) DRAM-BASED STORAGE DEVICE AND ASSOCIATED DATA PROCESSING METHOD

(71) Applicant: LITE-ON TECHNOLOGY CORPORATION, Taipei (TW)

(72) Inventors: Yi-Chung Lee, Taipei (TW); Jyun-Gong Yu, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 14 days.

This patent is subject to a terminal disclaimer.

(21) Appl. No.: 16/682,330

(22) Filed: Nov. 13, 2019

(65) Prior Publication Data

US 2020/0081777 A1    Mar. 12, 2020

Related U.S. Application Data

(63) Continuation-in-part of application No. 15/925,816, filed on Mar. 20, 2018, now abandoned.

(30) Foreign Application Priority Data

Feb. 2, 2018   (CN) .......................... 201810106147.7

(51) Int. Cl.
*G06F 11/10*    (2006.01)
*G11C 14/00*    (2006.01)
*G11C 11/4074*  (2006.01)

(52) U.S. Cl.
CPC ...... *G06F 11/1068* (2013.01); *G11C 11/4074* (2013.01); *G11C 14/0009* (2013.01)

(58) Field of Classification Search
CPC .... G06F 3/0659; G06F 3/0656; G06F 3/0604; G06F 11/1068; G06F 3/0673; G11C 11/4096; G11C 29/52
See application file for complete search history.

(56) References Cited

U.S. PATENT DOCUMENTS

| | | | | |
|---|---|---|---|---|
| 2009/0055713 | A1* | 2/2009 | Hong | G06F 11/10 714/763 |
| 2014/0101471 | A1* | 4/2014 | Bieswanger | G06F 1/3206 713/322 |
| 2015/0213854 | A1* | 7/2015 | Cordero | G11C 8/16 711/105 |
| 2016/0314837 | A1* | 10/2016 | Harrand | G06F 11/1068 |
| 2017/0123694 | A1* | 5/2017 | Miomo | G06F 11/165 |
| 2019/0074852 | A1* | 3/2019 | Khon | H04N 19/44 |

* cited by examiner

*Primary Examiner* — Thien Nguyen
(74) *Attorney, Agent, or Firm* — WPAT, PC

(57) ABSTRACT

A DRAM-based storage device includes a DRAM and a control circuit. The DRAM includes a buffering area and a host accessing area. A data is stored in the host accessing area. The control circuit is electrically connected with the DRAM. The control circuit copies a portion of the data from the host accessing area to the buffering area at a predetermined time interval counted by the control circuit. Before the portion of the data is written to the buffering area, a first ECC decoding operation is performed on the portion of the data to correct error bits contained therein. If the portion of the data is corrected, the control circuit rewrites the corrected portion of the data into the host accessing area.

18 Claims, 3 Drawing Sheets

DRAM-BASED STORAGE DEVICE AND ASSOCIATED DATA PROCESSING METHOD

This application is a Continuation-in-part of application Ser. No. 15/925,816, filed on Mar. 20, 2018, which claims the benefit of People's Republic of China Patent Application No. 201810106147.7, filed Feb. 2, 2018, the subject matter of which is incorporated herein by reference.

FIELD OF THE INVENTION

The present invention relates to a storage device and an associated data processing method, and more particularly to a DRAM-based storage device and an associated data processing method.

BACKGROUND OF THE INVENTION

As is well known, solid state devices (SSD) such as SD cards or solid state drives are widely used in various electronic devices.

FIG. 1 is a schematic functional block diagram illustrating the architecture of a conventional computer system with a solid state drive. As shown in FIG. 1, the computer system 180 comprises a host 150 and a solid state drive 100. The solid state drive 100 is connected with the host 150 through a bus 110. For example, the bus 110 is a USB bus, a SATA bus, a PCIe bus, a M.2 bus, a U.2 bus, or the like.

As shown in FIG. 1, the solid state drive 100 comprises a control circuit 10, a buffer 30 and a non-volatile memory 20. The control circuit 10 is connected with the non-volatile memory 20 and the buffer 30. For example, the buffer 30 is a dynamic random access memory (DRAM).

When the solid state drive 100 is in a normal working state, the control circuit 10 is operated according to the commands from the host 150. For example, according to a write command from the host 150, the control circuit 10 receives a write data from the host 150 and temporarily stores the write data into the buffer 30. Then, at the right time, the write data temporarily stored in the buffer 30 is subjected to an error correction code (ECC) encoding operation by the control circuit 10. After the ECC encoding operation is completed, the encoded write data is written into the non-volatile memory 20.

According to a read command from the host 150, the control circuit 10 acquires a read data from the non-volatile memory 20. After the read data is subjected to an ECC decoding operation, the decoded read data is temporarily stored in the buffer 30 and transmitted to the host 150.

Generally, the write data from the host 150 is stored in the non-volatile memory 20. The buffer 30 is a component of the solid state drive 100 for allowing the control circuit 10 to temporarily store data. That is, the host 150 is only able to access the data of the non-volatile memory 20, but unable to access the data of the buffer 30 directly.

However, while a writing action or an erasing action of the non-volatile memory 20 is performed, the efficiency is deteriorated and thus the time period of writing data is long. In other words, the performance of the solid state drive 100 cannot be effectively enhanced.

SUMMARY OF THE INVENTION

An embodiment of the present invention provides a DRAM-based storage device. The DRAM-based storage device includes a DRAM and a control circuit. The DRAM includes a buffering area and a host accessing area. A data is stored in the host accessing area. The control circuit is electrically connected with the DRAM. The control circuit automatically copies a portion of the data from the host accessing area to the buffering area at a predetermined time interval counted by the control circuit. Before the portion of the data is written to the buffering area, a first ECC decoding operation is performed on the portion of the data to correct error bits contained therein, if the portion of the data is corrected, the control circuit rewrites the corrected portion of the data into the host accessing area.

Another embodiment of the present invention provides a data processing method for a DRAM-based storage device. The DRAM-based storage device includes a control circuit and a DRAM. The DRAM includes a buffering area and a host accessing area. A data is stored in the host accessing area. Firstly, a portion of the data is automatically copied from the host accessing area to the buffering area at a predetermined time interval counted by the control circuit. Before the portion of the data is written to the buffering area, a first ECC decoding operation is performed on the portion of the data to correct error bits contained therein. If the portion of the data is corrected, rewriting the corrected portion of the data into the host accessing area.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

For solving the drawbacks of the conventional storage device, the present invention provides a DRAM-based storage device and an associated data processing method.

Figure 1:
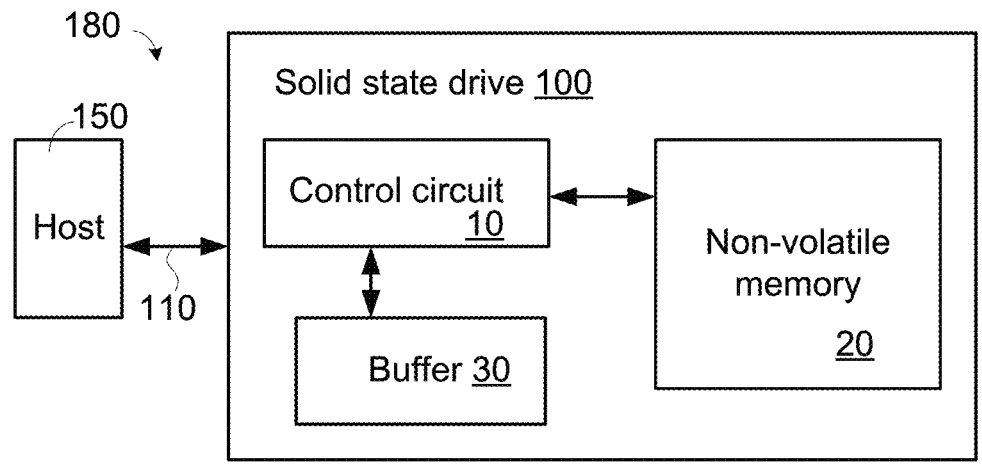
FIG. 1 (prior art) is a schematic functional block diagram illustrating the architecture of a conventional computer system with a solid state drive.
Figure 2:
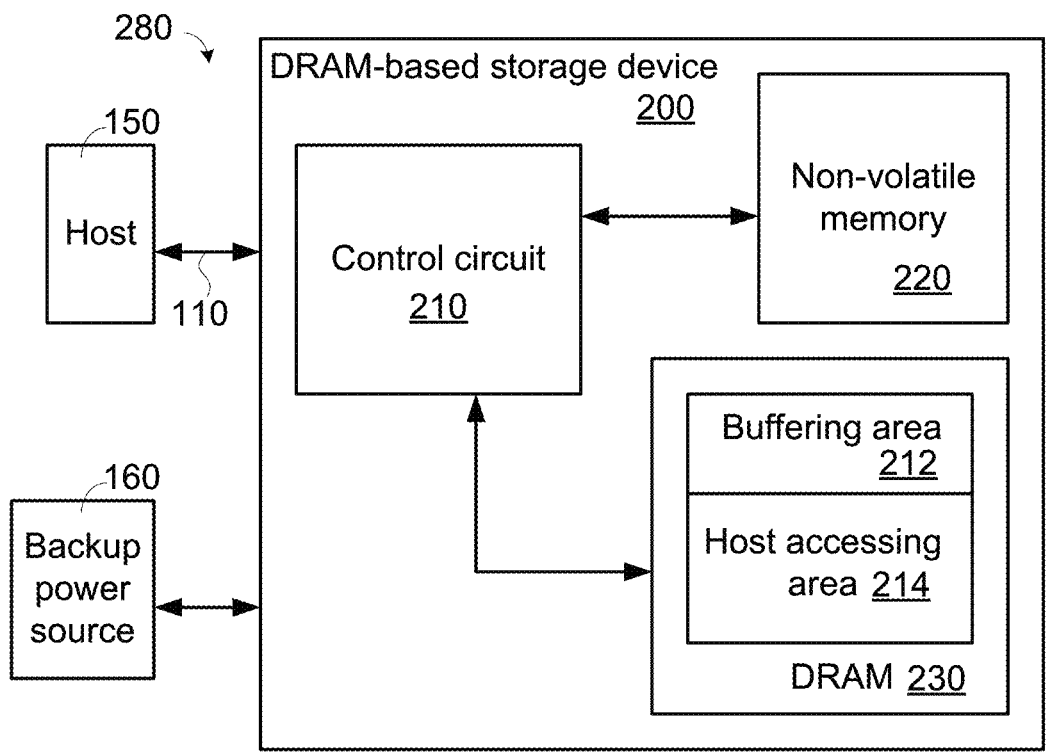
FIG. 2 is a schematic functional block diagram illustrating the architecture of a computer system with a DRAM-based storage device according to an embodiment of the present invention.

FIG. 2 is a schematic functional block diagram illustrating the architecture of a computer system with a DRAM-based storage device according to an embodiment of the present invention. As shown in FIG. 2, the computer system 280 comprises a host 150 and a DRAM-based storage device 200. The DRAM-based storage device 200 is connected with the host 150 through a bus 110. For example, the bus 110 is a USB bus, a SATA bus, a PCIe bus, a M.2 bus, a U.2 bus, or the like.

As shown in FIG. 2, the DRAM-based storage device 200 comprises a control circuit 210, a dynamic random access memory (DRAM) 230 and a non-volatile memory 220. The control circuit 210 is connected with the non-volatile memory 220 and the DRAM 230. The DRAM 230 comprises a buffering area 212 and a host accessing area 214. The host accessing area 214 is used for storing data.

When the host 150 is connected with the DRAM-based storage device 200, the host 150 detects two accessible regions of the DRAM-based storage device 200. The two accessible regions include the non-volatile memory 220 and the host accessing area 214 of the DRAM 230. That is, in the computer system 280, the host 150 detects two storage components of the DRAM-based storage device 200. Moreover, the host 110 can access any of the two storage components to write or read data.

The operations of the DRAM-based storage device 200 will be described as follows. In an embodiment, the storage capacity of the non-volatile memory 220 is 256G bytes, and the storage capacity of the DRAM 230 is 2G bytes. In the DRAM 230, the storage capacity of the host accessing area 214 is 1.5G bytes, and the storage capacity of the buffering area 212 is 0.5G bytes.

Since the accessing speed of the DRAM 230 is fast, the write data to be accessed at high speed or frequently accessed are stored from the host 150 to the host accessing area 214. The other write data from the host 150 are stored in the non-volatile memory 220. Consequently, the overall performance of the DRAM-based storage device 200 is enhanced. It is noted that the data stored in the host accessing area 214 are not restricted to the write data from the host 150. For example, in some other embodiments, some tables for guiding the control circuit 210 to write the data into the non-volatile memory 220 are stored in the host accessing area 214.

When the host 150 issues a write command to store the write data into the DRAM-based storage device 200, the control circuit 210 is operated according to the write command from the host 150.

For example, if the host 150 issues a write command to store the write data into the non-volatile memory 220, the control circuit 210 receives the write data from the host 150 and temporarily stores the write data into the buffering area 212. Then, at the right time, the write data temporarily stored in the buffering area 212 is subjected to an error correction code (ECC) encoding operation by the control circuit 210. After the ECC encoding operating is completed, the encoded write data is written into the non-volatile memory 220.

Whereas, if the host 150 issues a write command to store the write data into the host accessing area 214, the control circuit 210 receives the write data from the host 150 and performs a memory protection ECC (MPECC) encoding operation on the write data. After the MPECC encoding operation is completed, the encoded write data is written into the host accessing area 214. The MPECC encoding operation is different from the ECC encoding operation by using different algorithm with different error correction capability comparing with ECC encoding operation. The MPECC encoding operation has lower error correction capability comparing with that of the ECC encoding operation. Because DRAM 230 has lower rate of errors compared to the non-volatile memory 220, the data stored into the host accessing area 214 does not need strong error correction capability as the data stored in the non-volatile memory 220.

If the host 150 issues a read command to read the data from the non-volatile memory 220, the control circuit 210 acquired the read data from the non-volatile memory 220. After the read data is subjected to an ECC decoding operation, the decoded read data is temporarily stored in the buffering area 212 and transmitted to the host 150.

Whereas, if the host 150 issues a read command to read the data from the host accessing area 214, the control circuit 210 acquired the read data from the host accessing area 214. After the read data is subjected to a MPECC decoding operation, the decoded read data is transmitted to the host 150. The MPECC decoding operation uses different algorithm with different error correction capability comparing with ECC decoding operation. The MPECC decoding operation has lower error correction capability than the ECC decoding operation.

The buffering area 212 of the DRAM 230 is a region for allowing the control circuit 210 to temporarily store data. That is, the host 150 is unable to access the data of the buffering area 212 of the DRAM 230 directly.

As is well known, the stored data in the DRAM 230 are lost after the DRAM 230 is powered off. During the normal process of powering off the computer system 280, the host 150 issues a power-off command to the DRAM-based storage device 200. After the control circuit 210 receives the power-off command, the write data in the host accessing area 214 of the DRAM 230 are stored into the non-volatile memory 220. Consequently, the write data in the host accessing area 214 are not lost. In an embodiment, after the data in the host accessing area 214 are subjected to the MPECC decoding operation and the ECC encoding operation, the data are stored into the non-volatile memory 220. After the host 150 confirms that the write data in the DRAM 230 have been successfully stored into the non-volatile memory 220, the computer system 280 is powered off.

The DRAM-based storage device 200 further comprises a backup power source 160 disposed outside of the DRAM-based storage device 200. In case that the computer system 280 is suffered from sudden power interruption, the backup power source 160 starts to power the DRAM-based storage device 200. Consequently, the DRAM-based storage device 200 is maintained in the normal working state. Meanwhile, the write data in the host accessing area 214 of the DRAM 230 are transferred from the host accessing area 214 to the non-volatile memory 220 and stored into the non-volatile memory 220. In other words, even if the computer system 280 is suffered from sudden power interruption, the data in the host accessing area 214 are not lost. For example, the backup power source 160 is a capacitor with large capacitance (e.g., a supercapacitor) or a battery.

When the computer system 280 is powered on again, the write data that are transferred from the host accessing area 214 and stored into the non-volatile memory 220 in the previous power-off process will be read out. After the write data are subjected to the ECC decoding operation and the MPECC encoding operation sequentially, the write data is loaded into the host accessing area 214. After the write data are loaded into the host accessing area 214, the DRAM-based storage device 200 can be operated normally. Meanwhile, the host 150 is able to access the data of the non-volatile memory 220 or the host accessing area 214 arbitrarily. Moreover, the non-volatile memory 220 has a specified region only for storing the data from the host accessing area 214. During the process of powering off the computer system 280, the data in the host accessing area 214 are all transferred to and stored in the specified region of the non-volatile memory 220. When the computer system 280 is powered on, the data in the specified region of the non-volatile memory 220 is transferred to and stored into the host accessing area 214.

However, if the host 150 has not accesses the write data of the host accessing area 214 for a long time when the computer system 280 is in the power-on state, some problems occur. For example, no proper method is used to judge the condition of the write data in the host accessing area 214. Consequently, if the write data are lost or erroneous, the quality of the DRAM-based storage device 200 is adversely affected.

For example, if the host 150 has not accesses the write data of the host accessing area 214 after the write data has been stored into the host accessing area 214 for more than one year, some drawbacks occur.

Similarly, during the process of powering off the computer system 280, the data in the host accessing area 214 are all transferred to and stored in the specified region of the non-volatile memory 220 by the control circuit 210.

If the control circuit 210 finds the write data in the host accessing area 214 contain error bits during the process of storing the write data into the non-volatile memory 220, it takes a long time period for the control circuit 210 to perform an error correction on the write data and then store the corrected write data into the non-volatile memory 220. Under this circumstance, it is possibly too late to store the write data into the non-volatile memory 220. After the computer system 280 is powered off, the portion of the write data that are not transferred from the host accessing area 214 to the non-volatile memory 220 will be lost and cannot be recovered.

After the computer system 280 is powered on again, the computer system 280 cannot be normally operated because some of the write data in the host accessing area 214 have been lost.

For assuring the accuracy of the data in the host accessing area 214 of the DRAM 230, the present invention further provides a data processing method.

Figure 3:
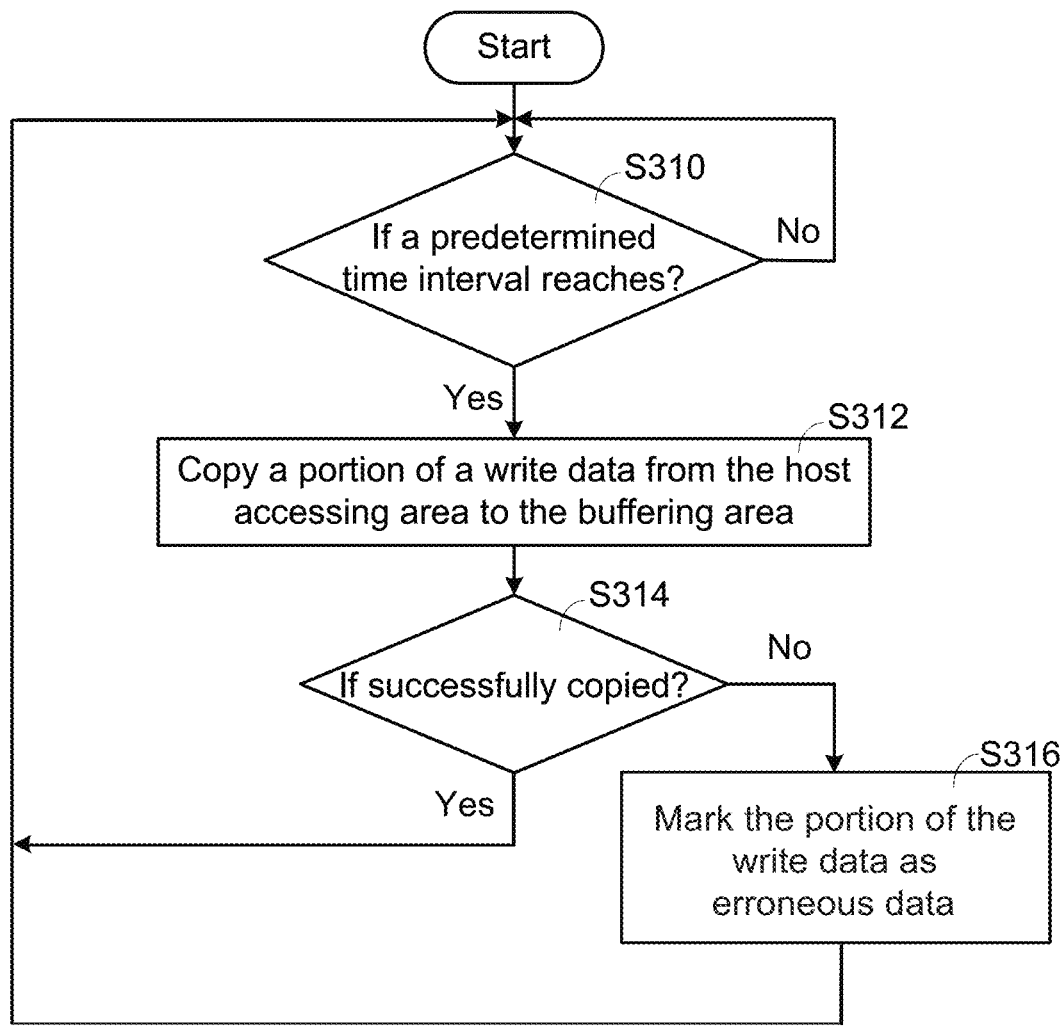
FIG. 3 is a flowchart illustrating a data processing method according to an embodiment of the present invention.

FIG. 3 is a flowchart illustrating a data processing method according to an embodiment of the present invention.

When the DRAM-based storage device 200 is in a normal working state, the control circuit 210 counts time. Moreover, the control circuit 210 performs a data confirming operation on the host accessing area 214 at a predetermined time interval (Step S310). For example, the predetermined time interval is 1 minute. The predetermined time interval can be adjusted by a user manually or by the control circuit 210 automatically depending on different situations. The control circuit 210 adjusts the time interval depending on at least one of a health state and a working state of the DRAM-based storage device 200. When the health state of the DRAM-based storage device 200 is not good (the value of the health state is under a threshold), the data stored in the DRAM 230 may be lost or inaccurate and the predetermined time interval is set to a shorter time, e.g., 30 seconds. The health state can include, for example, current state of the backup power source 160 (charged, discharged, charging, etc.), whether any capacitor of the backup power source 160 has failed, type of backup power source 160 (e.g., supercapacitor or battery), remaining data capacity of the host accessing area 214, and whether any storage cell of the DRAM 230 has failed.

When the working state of the DRAM-based storage device 200 is in the normal working state, the predetermined time interval is set to be 1 minute. When the DRAM-based storage device 200 is in an idle state, i.e., the DRAM-based storage device 200 is not busy reading or writing data, the predetermined time interval is set to a shorter time, e.g., 30 seconds.

When the predetermined time interval reaches, the control circuit 210 automatically copies a portion of a write data from the host accessing area 214 of the DRAM 230 to the buffering area 212 (Step S312).

If the portion of the write data is successfully copied by the control circuit 210 (Step S314), the control circuit 210 confirms that the portion of the write data in the host accessing area 214 is accurate. Consequently, the step S310 is repeatedly done. When the next predetermined time interval reaches, the data confirming operation on another portion of the write data in the host accessing area 214 is automatically performed.

Whereas, if the portion of the write data is not successfully copied by the control circuit 210 (Step S314), it means that the portion of the write data in the host accessing area 214 contains so many error bits and the portion of the write data cannot be corrected. Consequently, the storage location corresponding to the portion of the write data is marked by the control circuit 210 (Step S316). The marked storage location denotes a problematic data. Then, the step S310 is repeatedly done. When the next predetermined time interval reaches, the next data confirming operation is automatically performed.

During the process of powering off the computer system, the accurate data and the marked problematic data in the host accessing area 214 are completely transferred to and stored in the non-volatile memory 220. During the process of powering on the computer system, the previously stored accurate data and the marked problematic data are stored back to the host accessing area 214 from the non-volatile memory 220. When the host 150 wants to access the marked problematic data, an error message is sent to the host 150 indicating the data is erroneous and cannot be accessed.

Figure 4:
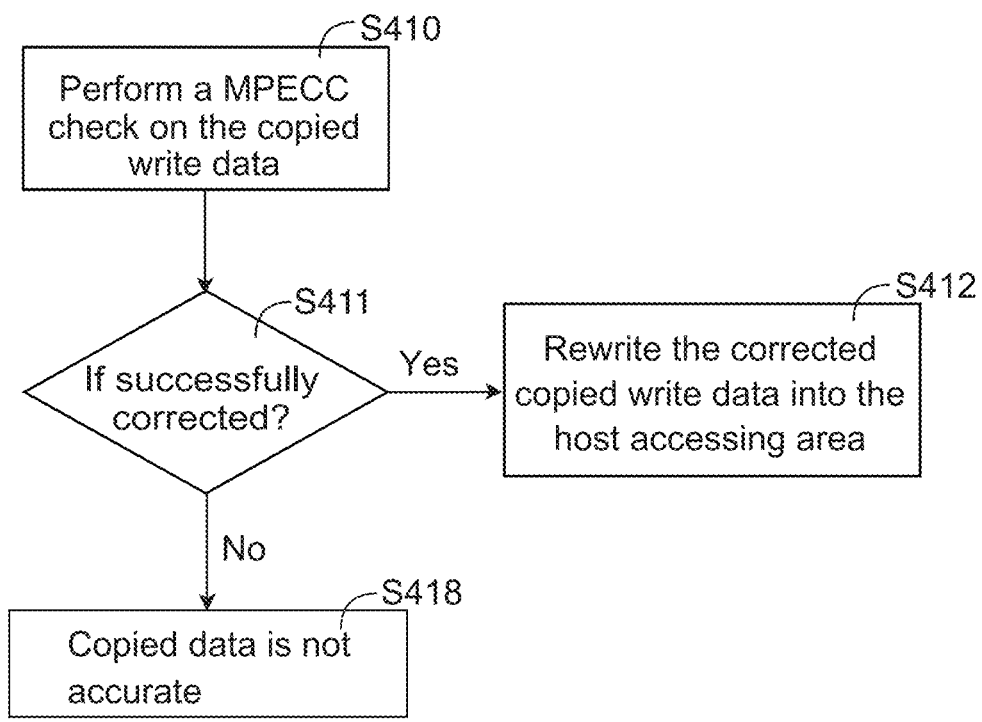
FIG. 4 is a flowchart illustrating a data confirming method according to an embodiment of the present invention.

FIG. 4 shows the flowchart of data confirming method determining the portion of the write data in the host accessing area 214 is successfully copied or not. When the portion of the write data in the host accessing area 214 is copied, the HLBA (host logical block address) corresponding to the copied write data is also obtained. Before the copied write data is written to the buffering area 212, a MPECC check is performed on the copied write data (Step S410). The control circuit 210 performs a memory protection ECC decoding operation on the copied write data (Step S410).

If the portion of the write data is successfully corrected by the control circuit 210 (Step S411), it means that the error bits have been corrected. Then, the control circuit 210 rewrites the corrected portion of the write data into the host accessing area 214 (Step S412) in order to assure the accuracy of the portion of the write data. The control circuit 210 also writes the corrected portion of the write data into the buffering area 212. Then, the control circuit 210 confirms the write data is successfully copied to the buffering area 212 and the step S310 is repeatedly done. When the next predetermined time interval reaches, the next data confirming operation is automatically performed.

Whereas, if the portion of the write data is not successfully corrected by the control circuit 210 (Step S411), it means that the error bits of the copied write data cannot be corrected by MPECC check. The portion of the write data is not written to the buffering area 212. Consequently, the HLBA corresponding to the copied write data is used to mark the storage location corresponding to the portion of the write data. The marked storage location denotes a problematic data.

In the above embodiment, the data processing method is performed on the write data that is issued from the host 150 and stored in the host accessing area 214. Alternatively, in another embodiment, the data processing method is performed on the data that is not issued from the host 150 but stored in the host accessing area 214. An example of the data processing method will be described as follows.

For example, each portion of the data in the host accessing area 214 has a specified size and is divided into plural units. For example, each portion of the data in the host accessing area 214 is 128k bytes and is divided into 256 units. That is, each unit is 512 bytes.

When the DRAM-based storage device 200 is in a normal working state, the control circuit 210 performs the data confirming operation on the portion of the data (e.g., 128k bytes) in the host accessing area 214 at a predetermined time interval (e.g., 1 minute).

While the data confirming operation is performed, the control circuit 210 executes a direct memory access copy function, which is also referred as a DMAC function. Consequently, the portion of the data (e.g., 128k bytes) in the host accessing area 214 is copied to the buffering area 212.

If the first portion of the write data (e.g., 128k bytes) in the host accessing area 214 is successfully copied into the buffering area 212, the control circuit 210 confirms that the first portion of the write data in the host accessing area 214 is accurate. The control circuit 210 confirms the first portion of the write data is accurate by the MPECC check. When the first portion of the write data passes MPECC check, the control circuit 210 rewrites the corrected first portion of the write data into the host accessing area 214 in order to assure the accuracy of the first portion of the write data. The corrected first portion of the write data is written to the buffering area 212. Then, the control circuit 210 confirms the first portion of the write data is successfully copied into the buffering area 212.

After the next predetermined time interval (e.g., 1 minute) reaches, the control circuit 210 automatically performs the data confirming operation on the second portion of the write data (e.g., 128k bytes) in the host accessing area 214. Then, the control circuit 210 performs the data confirming operation on the third portion of the write data (e.g., 128k bytes) in the host accessing area 214. Then, the control circuit 210 performs the data confirming operation on the fourth portion of the write data (e.g., 128k bytes) in the host accessing area 214. The rest may be deduced by analogy.

On the other hand, if the first portion of the write data is not successfully copied into the buffering area 212, the control circuit 210 confirms that the first portion of the write data in the host accessing area 214 contains error bits which cannot be corrected by MPECC check. Then, the storage location corresponding to the first portion of the write data is marked by the control circuit 210 according to the HLBA. The marked storage location denotes a problematic data. After the next predetermined time interval (e.g., 1 minute) reaches, the control circuit 210 automatically performs the data confirming operation on the 256 units of the second portion of the write data. The rest may be deduced by analogy.

From the above descriptions, the present invention provides a DRAM-based storage device and an associated data processing method. When the DRAM-based storage device is in the normal working state or the idle state, the control circuit continuously performs the data confirming operation on the data in the host accessing area. Consequently, the accuracy of the data in the host accessing area of the DRAM-based storage device is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A DRAM-based storage device, comprising:
   a DRAM comprising a buffering area and a host accessing area, wherein a data is stored in the host accessing area, wherein the host accessing area can be directly accessed by a host; and
   a control circuit electrically connected with the DRAM, wherein the control circuit automatically copies a portion of the data from the host accessing area to the buffering area at a predetermined time interval counted by the control circuit, wherein before the portion of the data is written to the buffering area, a first ECC decoding operation is performed on the portion of the data to correct error bits contained therein, if the portion of the data is corrected, the control circuit rewrites the corrected portion of the data into the host accessing area.

2. The DRAM-based storage device as claimed in claim 1, wherein while the portion of the data is copied, a host logical block address is obtained corresponding to the portion of the data.

3. The DRAM-based storage device as claimed in claim 2, wherein if the error bits are not successfully corrected, a storage location corresponding to the portion of the write data is marked by the control circuit according to the host logical block address, wherein the marked storage location indicates the portion of the write data corresponding to the storage location has error.

4. The DRAM-based storage device as claimed in claim 1, wherein the portion of the data is copied from the host accessing area to the buffering area after the control circuit executes a direct memory access copy function.

5. The DRAM-based storage device as claimed in claim 1, further comprising a backup power source disposed outside of the DRAM-based storage device to power the DRAM-based storage device, wherein the backup power source is a supercapacitor or a battery.

6. The DRAM-based storage device as claimed in claim 1, wherein if the host issues a write command to store a write data into the host accessing area, the control circuit performs a first ECC encoding operation on the write data and writes the encoded write data into the host accessing area, wherein if the host issues a write command to store a write data into a non-volatile memory, the control circuit performs a second ECC encoding operation on the write data and writes the encoded write data into the non-volatile memory, wherein the first ECC encoding operation has lower error correction capability than the second ECC encoding operation.

7. The DRAM-based storage device as claimed in claim 6, wherein if the host issues a power-off command to the DRAM-based storage device, the data stored in the host accessing area is stored into the non-volatile memory and the data is subjected to the first ECC decoding operation and the second ECC encoding operation and then stored into the non-volatile memory.

8. The DRAM-based storage device as claimed in claim 7, wherein if the host issues a power-on command to the DRAM-based storage device, the data stored in the non-volatile memory in the previous power-off process is read out and stored into the host accessing area and the data is subjected to a second ECC decoding operation and the first ECC encoding operation and then stored into the host accessing area, wherein the first ECC decoding operation has lower error correction capability than the second ECC decoding operation.

9. The DRAM-based storage device as claimed in claim 1, wherein the predetermined time interval is adjusted by the control circuit automatically depending on a health state and a working state of the DRAM-based storage device.

10. The DRAM-based storage device as claimed in claim 9, wherein the health state includes at least one of: current state of a backup power source, whether any capacitor of the backup power source has failed, type of the backup power source, remaining data capacity of the host accessing area and whether any storage cell of the DRAM has failed.

11. The DRAM-based storage device as claimed in claim 9, wherein the working state includes a normal working state and an idle state, and the predetermined time interval of the idle state is shorter than that of the normal working state.

12. A data processing method for a DRAM-based storage device, the DRAM-based storage device comprising a control circuit and a DRAM, the DRAM comprising a buffering area and a host accessing area, wherein the host accessing area can be directly accessed by a host, a data being stored in the host accessing area, the data processing method comprising steps of:
 (a) automatically copying a portion of the data from the host accessing area to the buffering area at a predetermined time interval counted by the control circuit;
 (b) before the portion of the data is written to the buffering area, a first ECC decoding operation is performed on the portion of the data to correct error bits contained therein; and
 (c) if the portion of the data is corrected, rewriting the corrected portion of the data into the host accessing area.

13. The data processing method as claimed in claim 12, wherein in the step (a), a direct memory access copy function is performed to copy the portion of the data from the host accessing area to the buffering area.

14. The data processing method as claimed in claim 12, wherein in the step (a), a host logical block address is obtained while copying the portion of the data.

15. The data processing method as claimed in claim 14, wherein after step (c), marking a storage location corresponding to the portion of the write data according to the host logical block address if the portion of the data is not corrected, wherein the marked storage location indicates the portion of the write data corresponding to the storage location has error.

16. The data processing method as claimed in claim 12, wherein before step (a), adjusting the predetermined time interval by the control circuit automatically depending on a health state and a working state of the DRAM-based storage device.

17. The data processing method as claimed in claim 16, wherein the working state includes a normal working state and an idle state, and setting the predetermined time interval of the idle state shorter than that of the normal working state.

18. The data processing method as claimed in claim 16, wherein the health state includes at least one of: current state of a backup power source, whether any capacitor of the backup power source has failed, type of the backup power source, remaining data capacity of the host accessing area and whether any storage cell of the DRAM has failed, and when the value of the health state is under a threshold, setting the predetermined time interval to a shorter time.

* * * * *